United States Patent
Date et al.

(10) Patent No.: US 10,381,095 B1
(45) Date of Patent: Aug. 13, 2019

(54) NON-VOLATILE MEMORY WITH SMART ERASE VERIFY

(71) Applicant: SANDISK TECHNOLOGIES LLC, Plano, TX (US)

(72) Inventors: Kei Date, Isehara (JP); Hideto Tomiie, Chigasaki (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/907,570

(22) Filed: Feb. 28, 2018

(51) Int. Cl.
| | | |
|---|---|---|
| *G11C 16/34* | (2006.01) | |
| *G11C 16/16* | (2006.01) | |
| *G11C 16/04* | (2006.01) | |
| *G11C 11/56* | (2006.01) | |
| *H01L 27/11524* | (2017.01) | |
| *H01L 27/11573* | (2017.01) | |
| *H01L 27/11556* | (2017.01) | |
| *H01L 27/11582* | (2017.01) | |
| *H01L 27/11519* | (2017.01) | |
| *H01L 27/11565* | (2017.01) | |
| *H01L 27/11529* | (2017.01) | |
| *H01L 27/1157* | (2017.01) | |

(52) U.S. Cl.
CPC ...... *G11C 16/3445* (2013.01); *G11C 16/0483* (2013.01); *G11C 16/16* (2013.01); *G11C 11/5635* (2013.01); *G11C 11/5671* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ............ G11C 16/3445; G11C 16/0483; G11C 16/16; G11C 11/5671; G11C 11/5635; H01L 27/11519; H01L 27/11582; H01L 27/11556; H01L 27/11529; H01L 27/11524; H01L 27/1157; H01L 27/11565; H01L 27/11573
USPC .................................................. 365/185.11
See application file for complete search history.

(56) References Cited

U.S. PATENT DOCUMENTS

| | | | |
|---|---|---|---|
| 6,903,981 B2 | 6/2005 | Futatsuyama | |
| 7,301,817 B2 | 11/2007 | Li | |
| 8,223,556 B2 | 7/2012 | Dutta | |
| 8,488,382 B1 | 7/2013 | Li | |
| 8,559,235 B2 | 10/2013 | Yoon | |
| 8,787,088 B2 | 7/2014 | Dutta | |
| 8,844,211 B2 | 9/2014 | Pensi | |
| 8,885,420 B2 | 11/2014 | Oowada | |
| 8,891,308 B1 | 11/2014 | Ou | |
| 8,908,435 B2 | 12/2014 | Li | |
| 9,142,298 B2 | 9/2015 | Dong | |
| 9,142,304 B2 | 9/2015 | Costa | |
| 9,214,240 B2 | 12/2015 | Dutta | |
| 9,224,494 B2 | 12/2015 | Chin | |
| 9,343,160 B1 | 5/2016 | Dutta | |
| 9,343,171 B1 | 5/2016 | Sun | |

(Continued)

*Primary Examiner* — Fernando Hidalgo

(74) *Attorney, Agent, or Firm* — Vierra Magen Marcus LLP

(57) ABSTRACT

In order to have different subsets of memory cells of a non-volatile memory system erase at the same speed, it is proposed to perform erasing by separately controlling the speed of erase for the different subsets in response to observing speed information for the subsets during the erasing.

20 Claims, 16 Drawing Sheets

(56) References Cited

U.S. PATENT DOCUMENTS

| | | |
|---|---|---|
| 9,443,597 B2 | 9/2016 | Dutta |
| 9,564,226 B1 | 2/2017 | Dunga |
| 9,786,378 B1 | 10/2017 | Zhang |
| 2008/0117688 A1 | 5/2008 | Park |
| 2013/0163336 A1* | 6/2013 | Li .................. G11C 16/0483 365/185.17 |
| 2014/0003147 A1* | 1/2014 | Dutta ............... G11C 11/5635 365/185.11 |
| 2018/0068740 A1* | 3/2018 | Lee .................... G11C 16/14 |

* cited by examiner

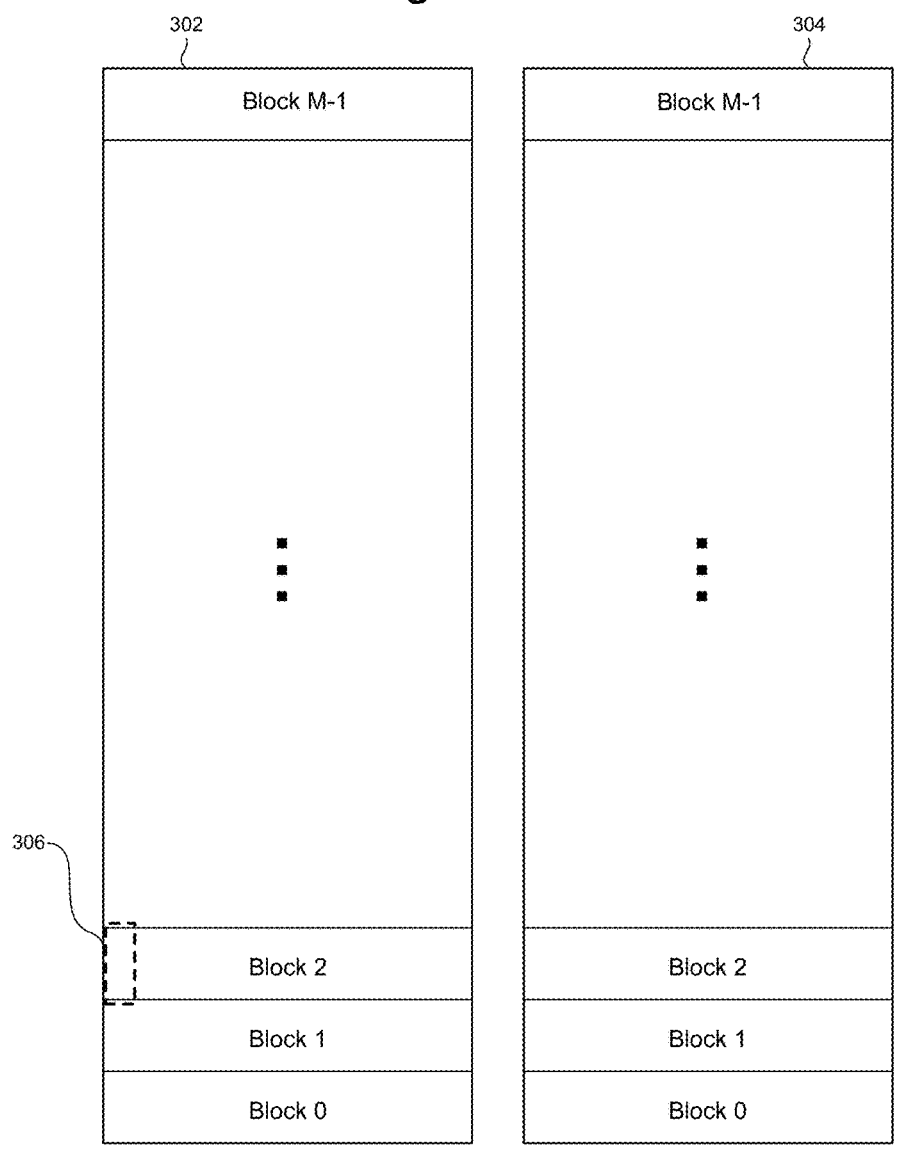

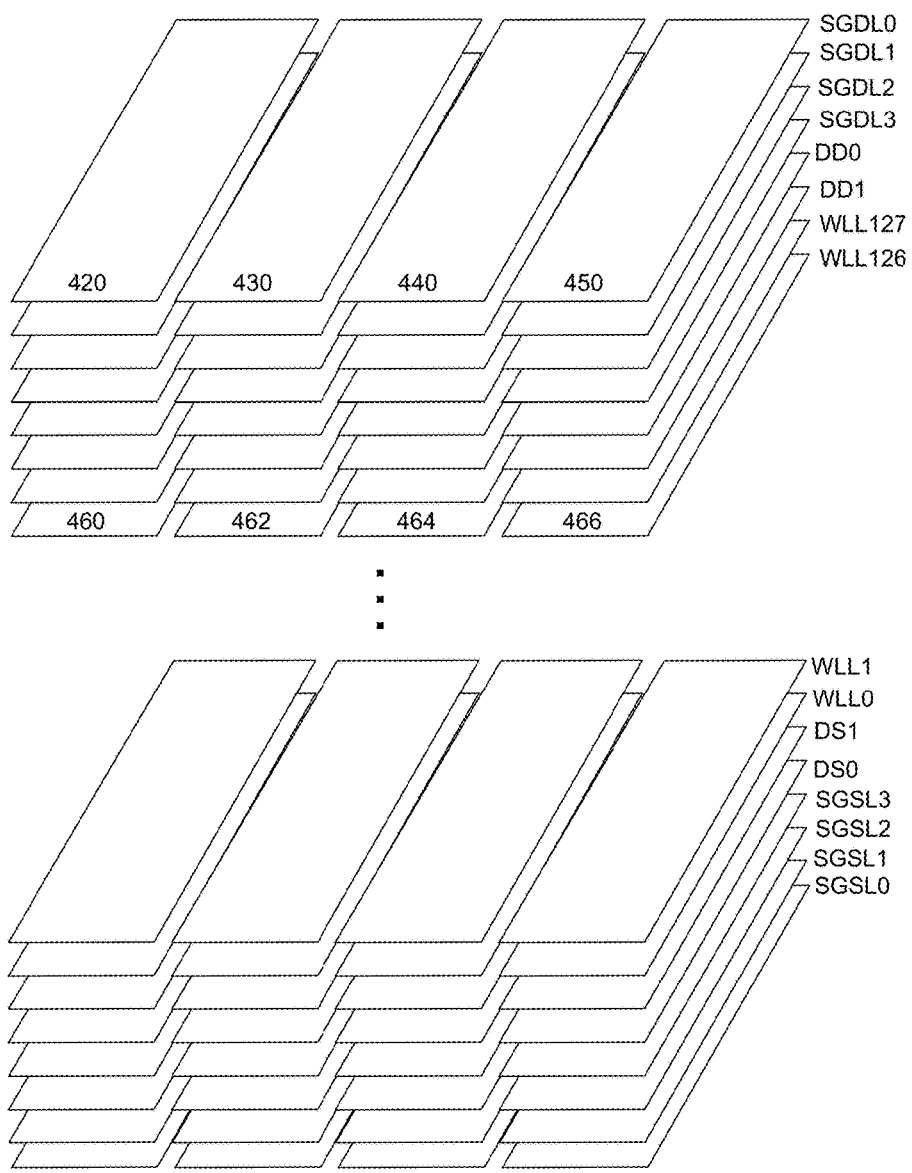

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

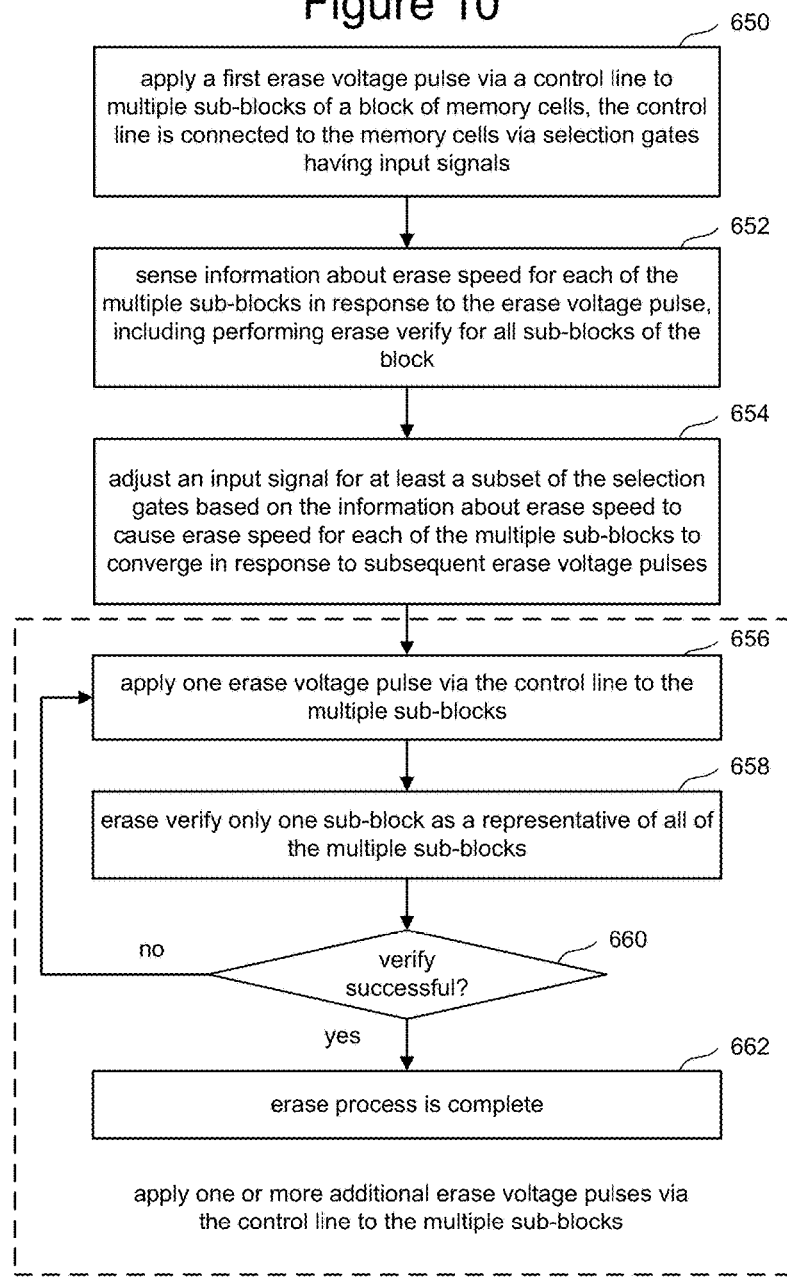

| high_count | Low_count | SGD/SGS bias next erase voltage pulse |
|---|---|---|
| Pass | Pass | Vesl |
| Pass | Fail | Vesl+offset1 |
| Fail | Fail | Vesl+offset2 |

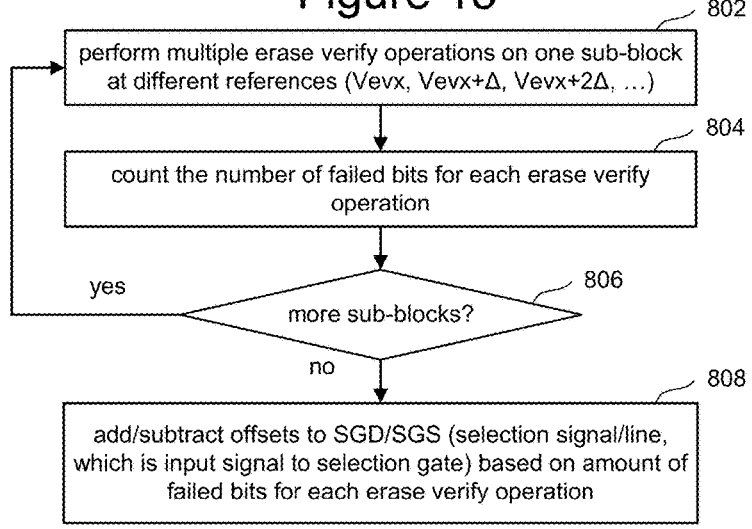

Figure 13 perform multiple erase verify operations on one sub-block at different references (Vevx, Vevx+Δ, Vevx+2Δ, ...) — 802 count the number of failed bits for each erase verify operation — 804 more sub-blocks? — 806 add/subtract offsets to SGD/SGS (selection signal/line, which is input signal to selection gate) based on amount of failed bits for each erase verify operation — 808

Figure 14

| Vevx | Vevx+Δ | SGD/SGS bias next erase voltage pulse |
|---|---|---|
| Pass | Pass | Vesl |
| Fail | Pass | Vesl+offset1 |
| Fail | Fail | Vesl+offset2 |

Figure 15

| Vevx | Vevx+Δ | Vevx+2Δ | SGD/SGS bias next erase voltage pulse |
|---|---|---|---|
| Pass | Pass | Pass | Vesl |
| Fail | Pass | Pass | Vesl+offset1 |
| Fail | Fail | Pass | Vesl+offset2 |
| Fail | Fail | Fail | Vesl+offset3 |

US 10,381,095 B1

NON-VOLATILE MEMORY WITH SMART ERASE VERIFY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. Performance of the memory system, such a speed of operation and power used, is important to hosts, clients, users, etc. that store data in the memory system.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIG. 10 is a flow chart describing one embodiment of a process for erasing non-volatile memory.

FIG. 13 is a flow chart describing one embodiment of a process for performing erase verify and adjusting erase speed.

FIG. 14 is a table providing an example of offsets to add to a selection signal in order to adjust erase speed.

FIG. 15 is a table providing an example of offsets to add to a selection signal in order to adjust erase speed.

DETAILED DESCRIPTION

In some memory systems, the memory cells are divided into subsets of memory cells, with each subset having signals for operating the subset. Due to variations within the memory, sometimes the different subsets may operate differently. For example, in response to the same erase signal the different subsets may erase at different speeds, which slows down the erase process, uses extra current/power and may cause some subsets (or portions thereof) to be over erased. Therefore, it is proposed to perform erasing by separately controlling the speed of erase for the subsets of memory cells in response to observing speed information for the subsets during the erasing In one embodiment, a group of connected memory cells are erased by applying an erase signal to the group, wherein the group of connected memory cells includes multiple sub-groups of connected memory cells. Applying the erase signal to the group includes applying the erase signal to all of the sub-groups of that group. Erase progress is determined for each of the sub-groups and erase speed is adjusted for a subset of the sub-groups based on the determined erase progress. In one example, embodiment, erase speed is adjusted by adding or subtracting a voltage (or current) offset to a control line for a selection gate that connects the sub-group of memory cells to the erase signal.

Figure 1:
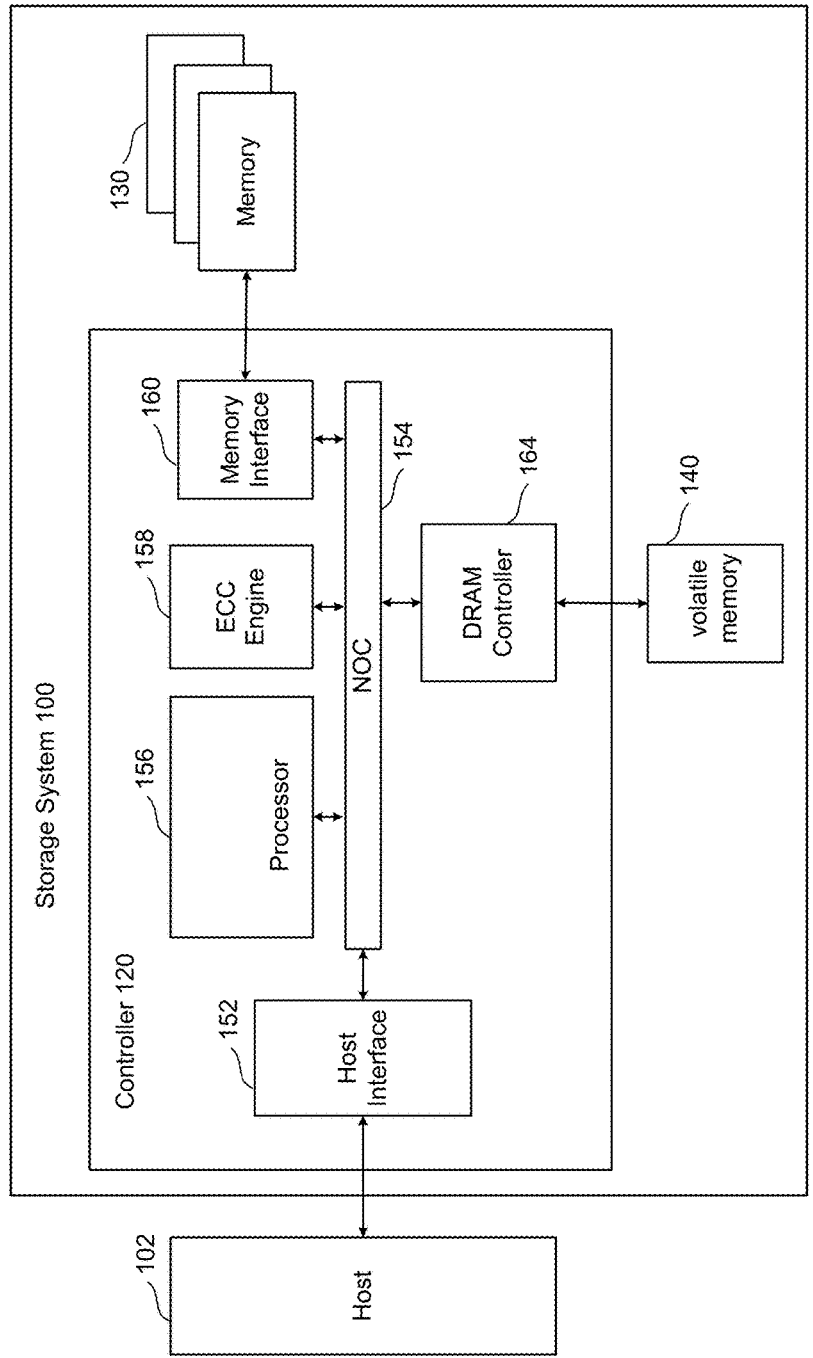
FIG. 1 is a block diagram depicting one embodiment of a memory system.

FIG. 1 is a block diagram of one embodiment of a memory system 100 that implements the proposed technology. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below with respect to Figure. Local high speed volatile memory 140 is used by controller 120 to perform certain functions. For example, local high speed volatile memory 140 stores logical to physical address translation tables ("L2P tables.")

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections.

NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with multiple memory die 130. In one embodiment, memory interface provides a Toggle Mode interface. In some example implementations, memory interface 160 (or another portion of controller 120) implements a scheduler and buffer for transmitting data to and receiving data from one or more memory die.

Figure 2:
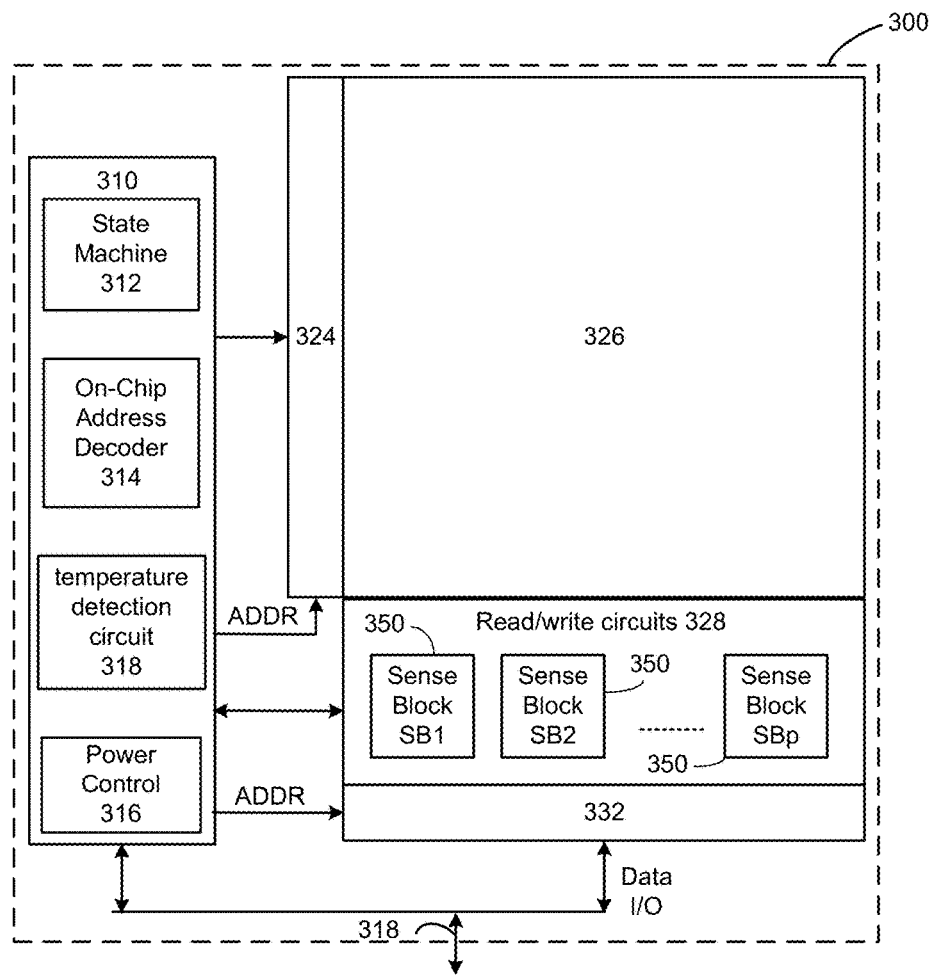
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. Commands and data are transferred between the controller and the memory die 300 via lines 318. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

The sense blocks include bit line drivers. For purposes of this document, control circuitry 310, read/write circuits 328, and decoders 324/332 comprise a control circuit for memory structure 326. In other embodiments, other circuits that support and operate on memory structure 326 can be referred to as a control circuit.

For purposes of this document, control circuitry 310, read/write circuits 328, and decoders 324/332 comprise peripheral circuits for memory structure 326, as they are not part of memory structure 326 but are on the same die as memory structure 326 and are used to operate memory structure 326.

In one embodiment, memory structure 326 comprises a three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
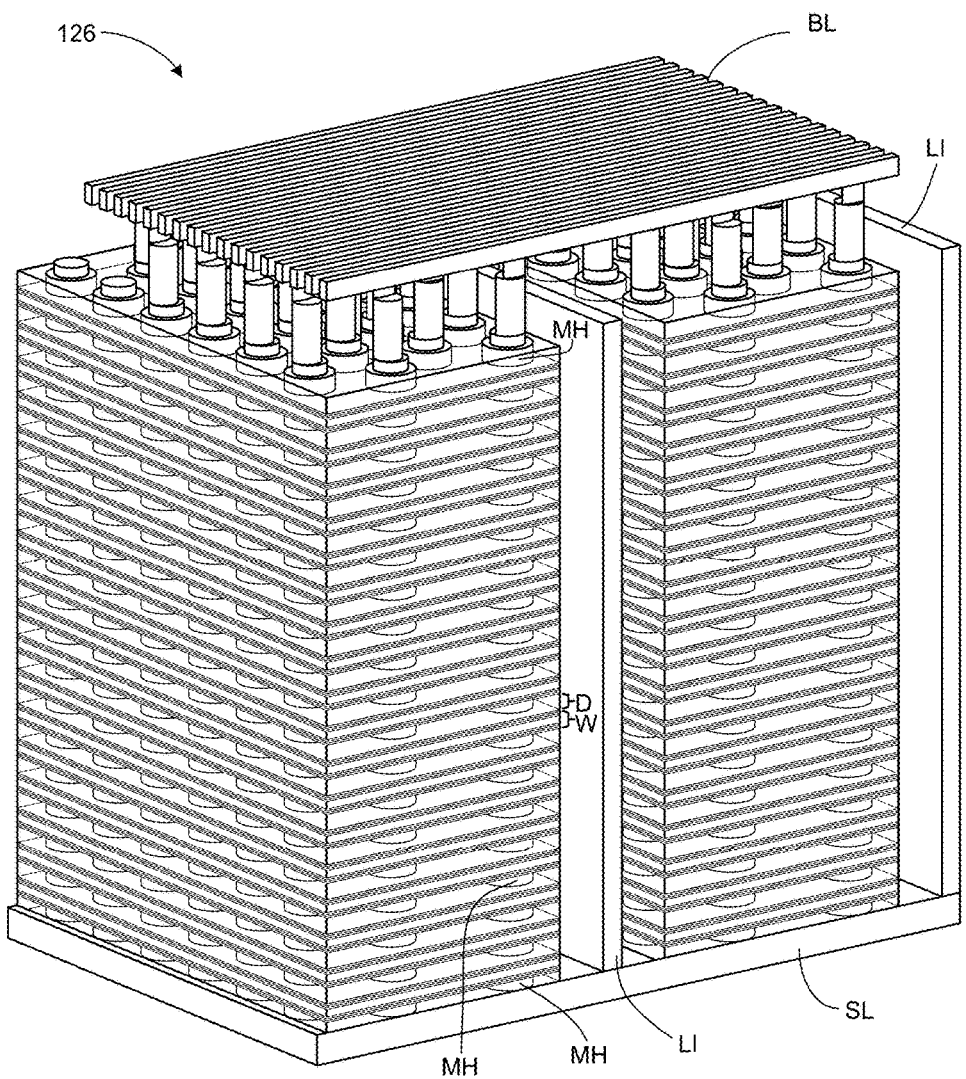
FIG. 3 is a perspective view of a portion of one embodiment of a monolithic three dimensional memory structure.

FIG. 3 is a perspective view of a portion of one example embodiment of a monolithic three dimensional memory array that can comprise memory structure 126, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 3 shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory array that comprises memory structure 126 is provided below with respect to FIG. 4A-4F.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
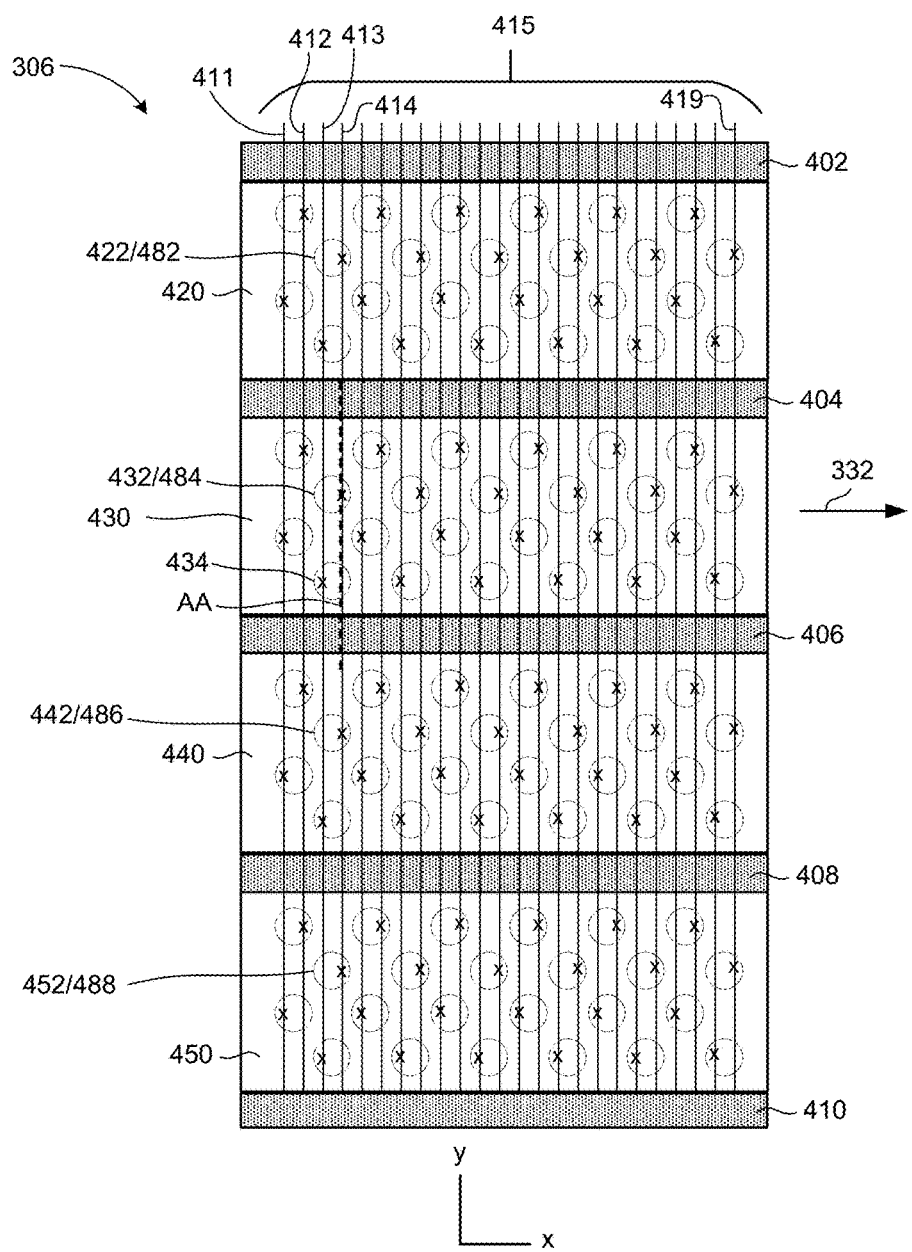
FIG. 4B depicts a top view of a portion of a block of memory cells.

FIGS. 4B-4F depict an example three dimensional ("3D") NAND structure. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has sixty layers. Other embodiments have less than or more than sixty layers. However, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
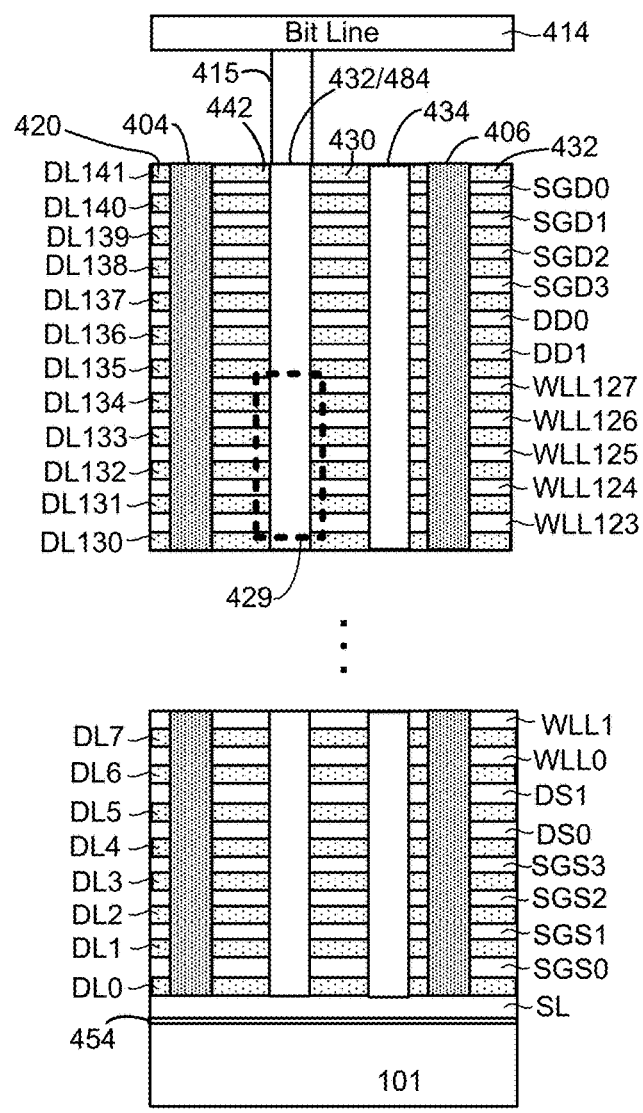
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL127 for connecting to data memory cells. Other embodiments can implement more or less than four drain side select layers, more or less than four source side select layers, more or less than four dummy word line layers, and more or less than one hundred and twenty eight word line. Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL141. For example, dielectric layers DL131 is above word line layer WLL123 and below word line layer WLL124. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL126 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
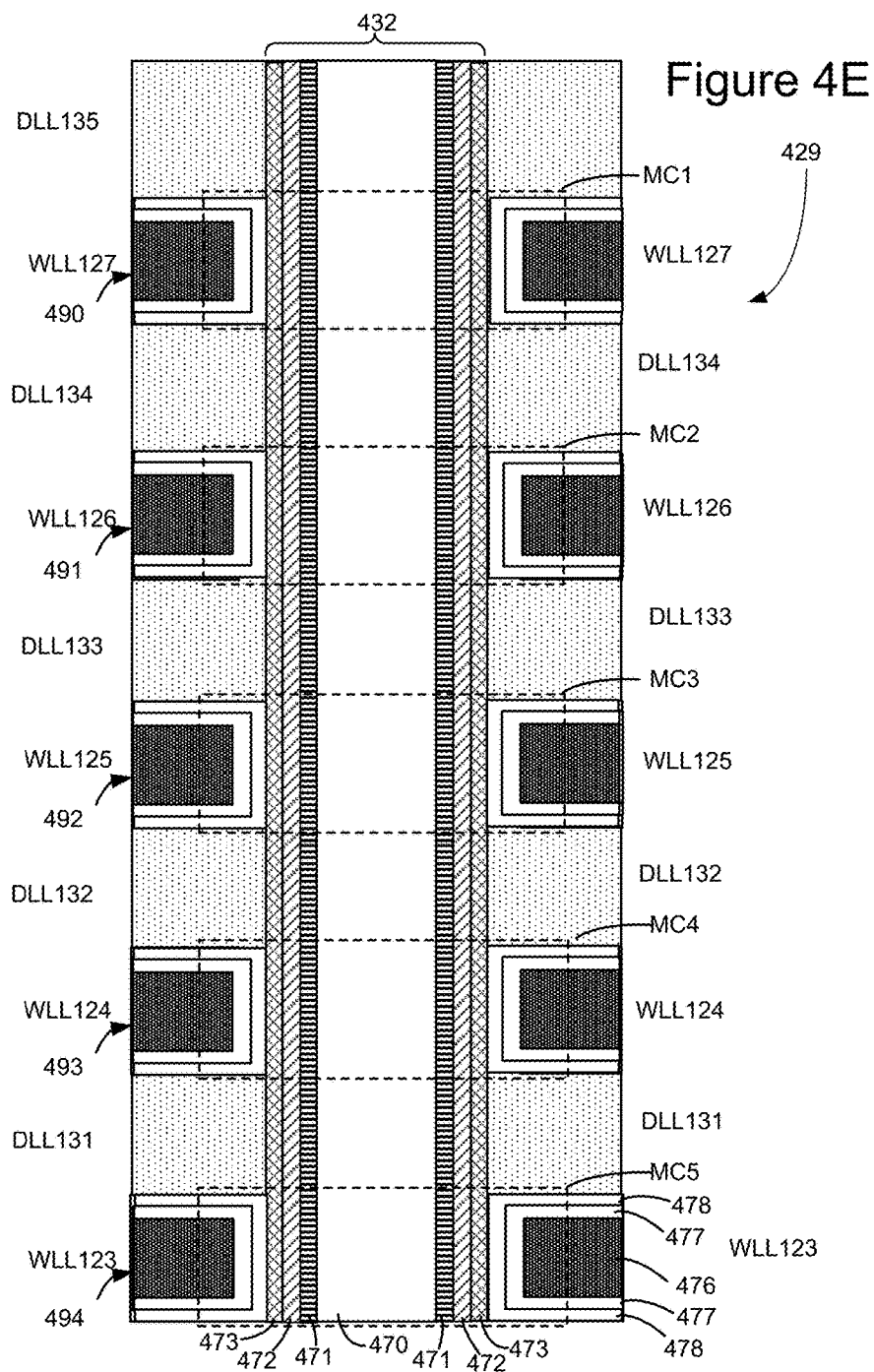
FIG. 4E is a cross sectional view of a vertical column of memory cells.

FIG. 4E depicts a cross sectional view of region 429 of FIG. 4C that includes a portion of vertical column 432. In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL131, DLL132, DLL133, DLL134 and DLL135, as well as word line layers WLL123, WLL124, WLL125, WLL126, and WLL127. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL127 and a portion of vertical column 432 comprise a memory cell MC1. Word line layer WLL126 and a portion of vertical column 432 comprise a memory cell MC2. Word line layer WLL125 and a portion of vertical column 432 comprise a memory cell MC3. Word line layer WLL124 and a portion of vertical column 432 comprise a memory cell MC4. Word line layer WLL123 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
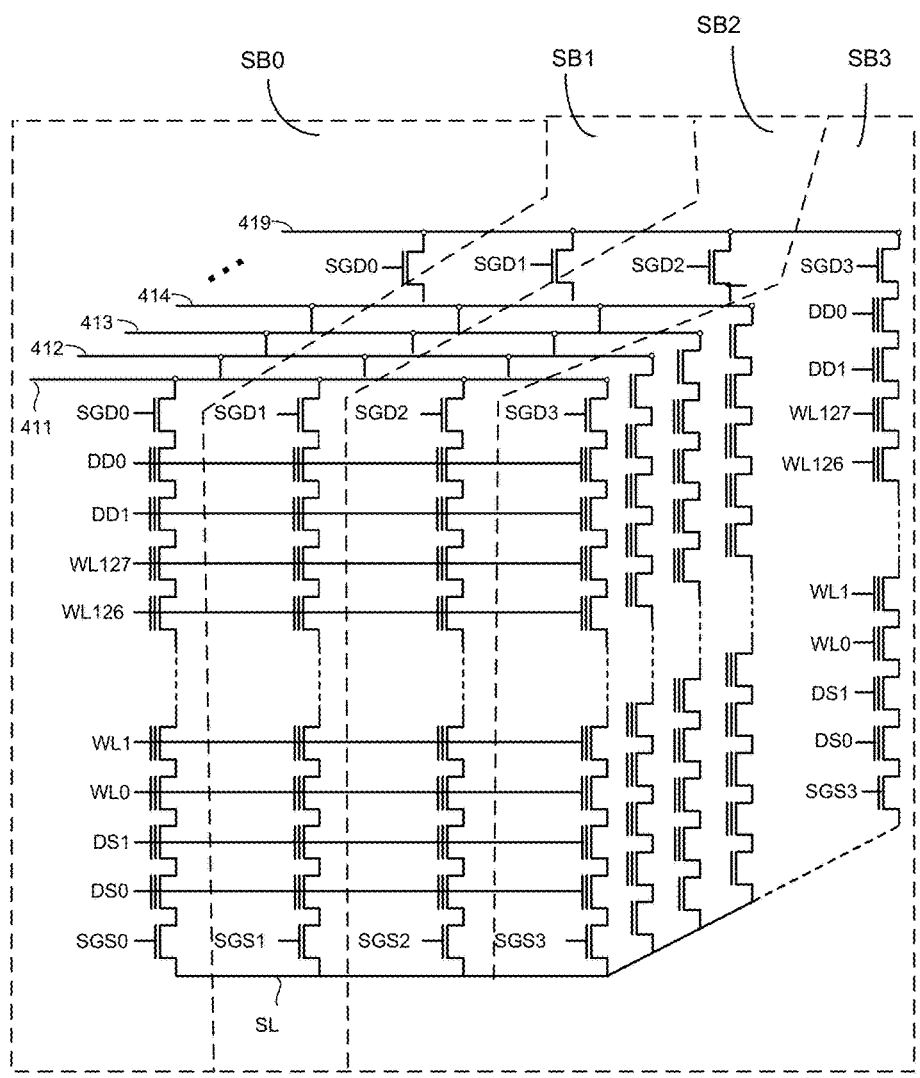
FIG. 4F is a schematic of a plurality of NAND strings.

FIG. 4F is a schematic diagram of a portion of the memory depicted in FIGS. 3-4E. FIG. 4F shows physical word lines WLL0-WLL127 running across the entire block. The structure of FIG. 4F corresponds to portion 306 in Block 2 of FIGS. 4A-E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4F is a three dimensional memory structure that includes vertical NAND strings with charge-trapping material, other (2D and 3D) memory structures can also be used with the technology described herein.

Figures 5, 6:
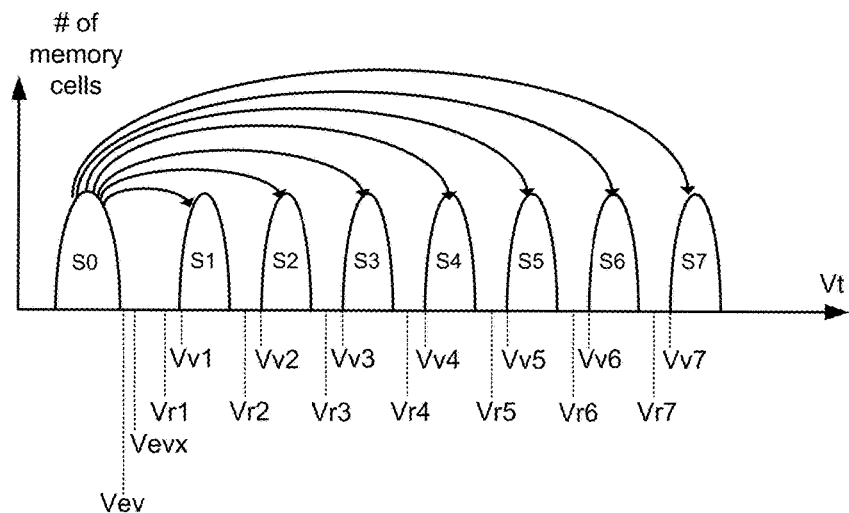
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5 also shows Vev, which is a voltage level to test whether a memory cell has been properly erased.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on error correction to identify the correct data being stored.

FIG. 6 is a table describing one example of an assignment of data values to data states. In the table of FIG. 6, S0=111. S1=110, S2=200, S3=000, S4=010, S5=011, S6=001 and S7=101. Other encodings of data can also be used. No particular data encoding is required by the technology disclosed herein.

In one embodiment, when a block is subjected to an erase operation, all memory cells are moved to data state S0, the erased state. In the embodiment of FIG. 6, all bits stored in a memory cell are 1 when the memory cells is erased (e.g., in data state S0).

In the embodiments described above with respect to FIGS. 4A-4F, the memory cells in a block are divided into sub-blocks (e.g., SB0, SB1, SB2, SB3) of memory cells, with each sub-block having different selection signals (e.g., SGS0, SGS1, SGS2, SGS3, SGD0, SGD1, SGD2, SGD3) for operating the sub-block. For example, SGS0 and SGD0 operate sub-block SB0, SGS1 and SGD1 operate sub-block SB1, SGS2 and SGD2 operate sub-block SB2, and SGS3 and SGD3 operate sub-block SB3. Due to variations within the memory, sometimes the different sub-blocks may operate differently. For example, in response to the same erase signal, the different sub-blocks (e.g., SB0, SB1, SB2, SB3) may erase at different speeds, which slows down the erase process, uses extra current/power and may cause some sub-sets (or portions thereof) to be over erased. The erase process is slowed because even though sub-blocks that erase faster can be locked out, the whole process cannot complete until the slowest sub-block is successfully erased. Therefore, it is proposed to perform erasing by separately controlling the speed of erase for the sub-blocks (e.g., SB0, SB1, SB2, SB3) in response to observing speed information for the sub-blocks (e.g., SB0, SB1, SB2, SB3) during the erasing process for the block that contains the sub-blocks.

Figure 7:
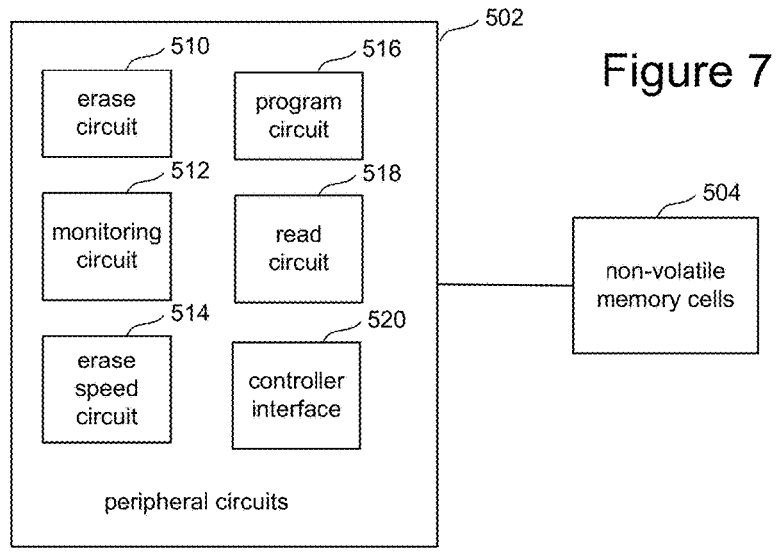
FIG. 7 is a block diagram depicting one embodiment of a memory system.

One embodiment of a memory system that performs erasing by separately controlling the speed of erase for the sub-blocks (e.g., SB0, SB1, SB2, SB3) in response to observing speed information for the sub-blocks during the erasing is depicted in FIG. 7, which is a block diagram of one example implementation of the apparatus of FIG. 2. FIG. 7 shows peripheral circuits 502 electrically connected to non-volatile memory cells 504. In some embodiments, non-volatile memory cells 504 are any of the memory structures discussed above, including the structures of FIGS. 3-4F. Non-volatile memory cells 504 can represent the one or more memory die 130. Peripheral circuits 502 is one example implementation of control circuitry 310, Read/write circuits 328 and decoders 332/324. In one embodiment, peripheral circuits 502 comprises erase circuit 510, monitoring circuit 512, erase speed circuit 514, program circuit 516, read circuit 518 and controller interface circuit 520, all of which are electrical circuits. Erase circuit 510, monitoring circuit 512, erase speed circuit 514, program circuit 516 and read circuit 518 are electrically connected to non-volatile memory cells 504. Erase circuit 510 erases non-volatile memory cells 504. Monitoring circuit 512 is used to monitor behavior and operation of non-volatile memory cells 504. Erase speed circuit 514 is used to vary the speed of the erase process. Program circuit 516 programs the non-volatile memory cells 504. Read circuit 518 reads data from non-volatile memory cells 504. Controller interface circuit 520 provides an interface to controller 120 (see FIG. 1).

Figure 8:
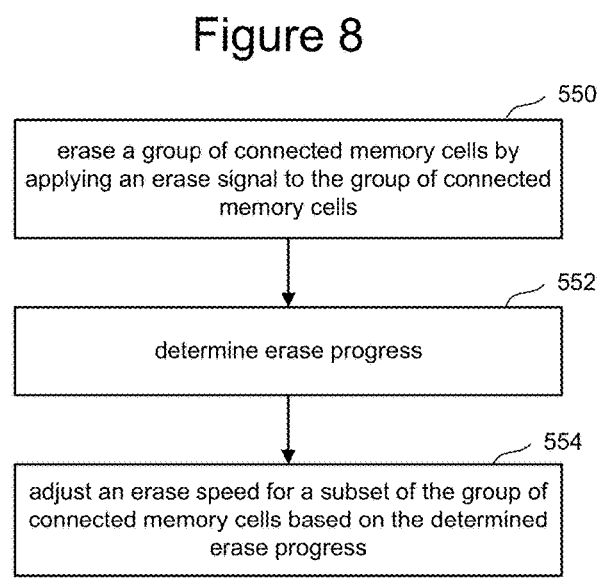
FIG. 8 is a flow chart describing one embodiment of a process for erasing non-volatile memory.

FIG. 8 is a flow chart describing one embodiment of a process for erasing by separately controlling the speed of erase for different subsets of memory cells (e.g., different sub-blocks of a block). The process of FIG. 8 describes an example operation of the components of FIG. 7, as well as the components of FIG. 2. In step 550 of FIG. 8, erase circuit 510 (or other peripheral circuit) erases a group of connected memory cells by applying an erase signal to the group of connected memory cells. In one example, the group of memory cells includes a block of memory cells; however, other groups of memory cells can also be used. In one embodiment, the erase signal is a voltage pulse (erase voltage pulse) that is applied to a control line for the block of memory cells. For example, an erase voltage pulse can be applied to a source line for the block of memory cells or to one or more bit lines that connect to multiple sub-blocks. In step 552 of FIG. 8, monitoring circuit 512 (or other peripheral circuit) monitors/determines the erase progress for the group of connected memory cells. For example, when the group of connected memory cells includes multiple sub-groups of connected memory cells (e.g. a block is divided up into multiple sub-blocks, as described above, the monitoring circuit 512 is configured to determine erase progress for each of the sub-group's connected memory cells). In step 554, erase speed circuit 514 (or other peripheral circuit) adjusts erase speed for a subset of the group of connected memory cells based on the determined erase progress from step 552. Thus, erase speed circuit 514 is in communication with monitoring circuit 512 and erase circuit 510. In some embodiments, each of step 550-554 are performed by state machine 312 of FIG. 2 or a microcontroller.

Figure 9:
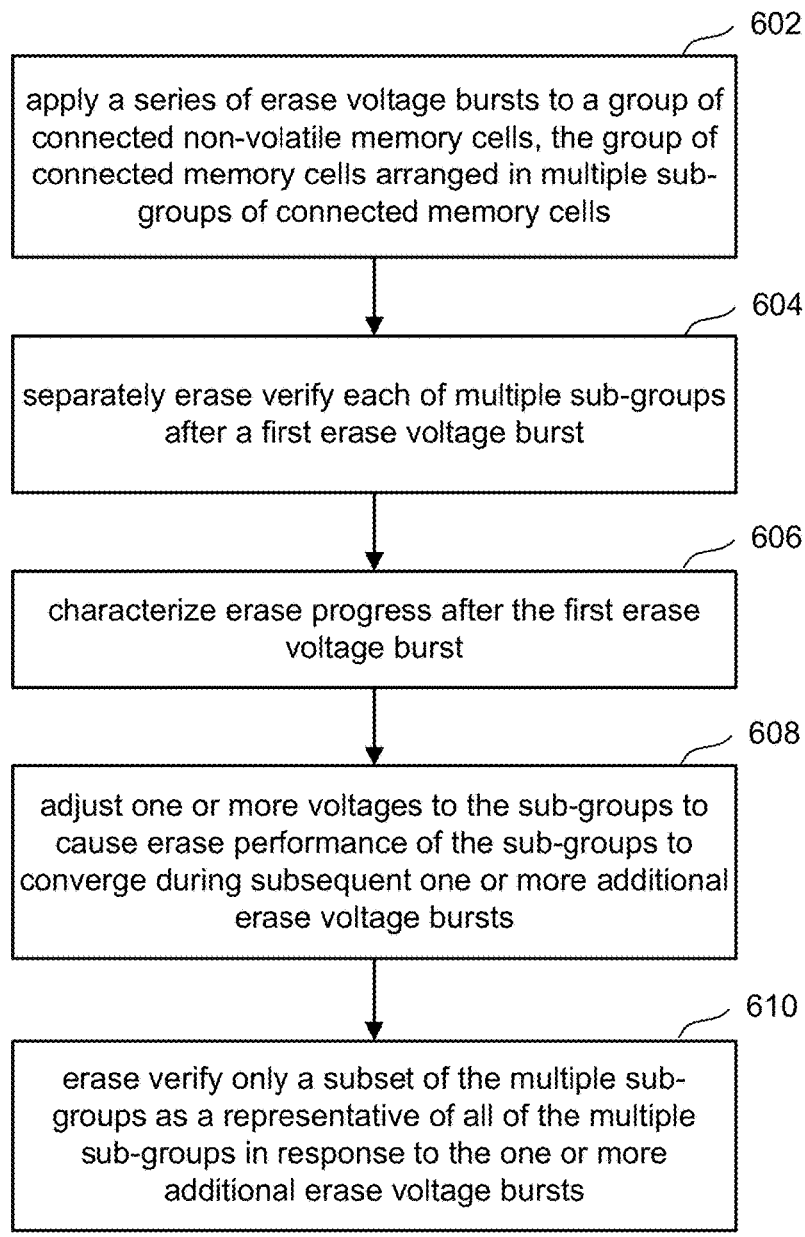
FIG. 9 is a flow chart describing one embodiment of a process for erasing non-volatile memory.

FIG. 9 is a flowchart describing more details of an example implementation of the process of FIG. 8. That is, FIG. 9 is a flowchart describing an embodiment of a process for erasing by separately controlling the speed of erase for different subsets of memory cells (e.g., different sub-blocks of a block). The process of FIG. 9 describes an example operation of the components of FIG. 7, as well as the components of FIG. 2. For example, in one embodiment, the process of FIG. 9 is performed by the components of FIG. 2 at the control of state machine 312 (or a microcontroller). In step 602, the system applies a series of erase voltage bursts to a group of connected non-volatile memory cells. The group of connected non-volatile memory cells are arranged in multiple sub-groups of connected memory cells. For example, the group of memory cells can be a block of memory cells and the multiple sub-groups can include multiple sub-blocks, as described above. Other arrangements can also be used. The technology described herein is not limited to a block. Rather, a block is one example of a group of connected memory cells. For purposes of this document, a voltage burst is a continuous supply of voltage. A voltage bolt burst can be in the form of a pulse; however, a burst is not limited to a pulse and can be in other forms as well (e.g., a sine wave or other function). The purpose of the erase voltage burst is to cause memory cells to be erased. For example, programmed memory cells may exist in data states S1-S7 of FIG. 5. The erase process moves the memory cells back into the erase state S0. In one example implementation, it will take multiple erase bursts to move the memory cells from the programmed data states S1-S7 to the erased data state S0. Thus, each erase voltage burst will move the memory cells partially toward erased data state S0. In between erase voltage bursts, the system performs erase verify. In step 604, the system performs erase verify separately for each of the multiple sub-groups after the first erase voltage burs. In one embodiment, step 602 and step 604 are performed by erase circuit 510 of FIG. 7. In one example implementation of step 602, the erase voltage burst is concurrently applied to all memory cells of all sub-groups of a single group (e.g. all memory cells of all sub-blocks of a single block).

In step 606, the system characterizes the erase progress after the first erase voltage burst. In one embodiment, step 606 is performed by monitoring circuit 512. For example, monitoring circuit 512 (or another peripheral circuit) determines how fast the memory cells are erasing. In step 608, the system adjusts one or more voltages to the sub-groups to cause erase performance of the sub-groups to converge during subsequent one or more erase voltage bursts. That is, the voltages to the sub-groups can be increased or decreased in order to speed up or slow down the erase speed of the individual sub-groups so that all of the sub-groups will erase at the same speed and (hopefully) complete the erase process at the same time (or almost the same time). In one embodiment, step 608 is performed by erase speed circuit 514 (or another peripheral circuit).

In step 610 of FIG. 9, the system performs erase verify in between additional one or more erase voltage bursts. An erase verify operation test whether the memory cells are properly erased. However, in step 610, the erase verify is only performed on a subset of the multiple sub-groups, such that the subset serves as a representative of all the sub-groups. Thus, in step 604, erase verify is performed for all of the multiple sub-groups while in step 610 erase verify is only performed by a subset of the multiple sub-groups. By reducing the amount of sub-groups that are the subject to the erase verify process in step 610, the overall erase process is performed quicker. In one embodiment, step 610 of FIG. 9 is performed by erase circuit 510 (or other peripheral circuit). In some embodiments, each of step 602-620 are performed by state machine 312 of FIG. 2 or a microcontroller.

FIG. 10 is flowchart describing additional details of an example implementation of the process of FIG. 8 and/or the process of FIG. 9. Thus, FIG. 10 is a flowchart describing one embodiment of a process for erasing by separately controlling the speed of erase for different subsets of memory cells. The process of FIG. 10 describes an example of operation of the components of FIG. 2 and/or FIG. 7. The process of FIG. 10 assumes the structure depicted in FIGS. 3-4F. In one embodiment, erasing memory cells involves boosting the channel voltage while holding the control gate of the memory cells at a low voltage (e.g., 0 volts). Various approaches can be used to boost the channel voltage. One approach includes generating holes at the source side and/or drain side select gate transistors using gate induced drain leakage (GIDL). This can be accomplished by applying a set of voltage pulses that increase in magnitude to the source line SL and/or bit lines BL. More detail is described below.

In step 650 of FIG. 10, the system applies a first erase voltage pulse via a control line to multiple sub-blocks of a block of memory cells. The control line is connected to the memory cells via selection gates having input signals. Looking at FIG. 4F, examples of control lines include bit lines and source lines. For example, FIG. 4F shows bit lines 411, 412, 413, 414, . . . 419. FIG. 4F also shows source line SL. The source line SL is connected to the vertical NAND strings via selection gates. The selection gates have input signals, also referred to as selection signals or selection lines, labeled in FIG. 4F as SGS0, SGS1, SGS2, and SGS3. In one embodiment, all of the NAND strings of a block are connected to a common source line. Each NAND string will have its own selection gate. All the NAND strings of a sub-block will share the same selection line (e.g., one of SGS1, SGS1, SGS2, or SGS3). In one embodiment (e.g. FIGS. 4A-F), each bit line is connected to one NAND string in each sub-block (e.g., SB0, SB1, SB2, SB3). Each NAND string has its own drain side selection gate connected to a drain side selection line (e.g., SGD0, SGD1, SGD2, and SGD3). Each NAND string in a common sub-block is connected to the same drain side selection line (e.g., one of SGD0, SGD1, SGD2, and SGD3).

In step 652 of FIG. 10, the system senses information about erase speed for each of the multiple sub-blocks in response to the erase voltage pulse, including performing erase verify for all of the sub-blocks of the block. Looking at FIG. 5, in one embodiment, erase verify can be performed by testing whether the threshold voltage of each memory cell is above or below the voltage compare level of Vevx. However, in one embodiment of step 652, the erase verify operation may include testing whether the memory cells of each sub-block have a threshold voltage greater than or less than Vevx. Because an entire NAND string is being erased (or entire block is being erased), all the memory cells on a NAND string are tested. If the NAND string conducts current, then all the memory cells on the NAND string have passed erase verify. If the NAND string does not conduct, then one or more of the memory cells have not passed erase verify.

Figure 10A:
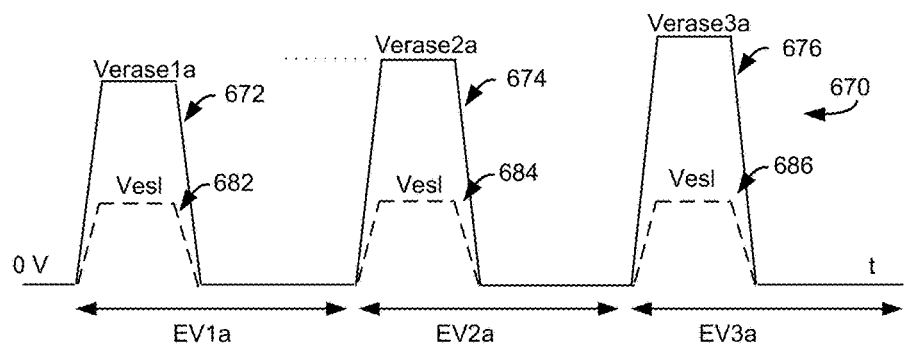
FIG. 10A is a signal diagram depicting an erase voltage applied to a control line and a selection signal applied to a selection line that is connected to a select gate.

In step 654 of FIG. 10, the system adjusts one or more input signals for at least a subset of the selection gates based on the information about erase speed (step 652) to cause erase speed for each (or some) of the multiple sub-blocks to converge in response to subsequent erase voltage pulses. The input signals apply to the selection signals (e.g., SGD0, SGD1, SGD2, SGD3, SGS0, SGS1, SGS2, and SGS3 of FIGS. 4C, 4D and 4F). More details of steps 650-654 are discussed below with respect to FIGS. 10A and 11-15.

After adjusting the input signal for a subset of selection gates in step 654, the system applies one or more additional erase voltage pulses via the control line (e.g. bit line and/or source line) to the multiple sub-blocks by performing steps 656-662. In step 656, the system applies one erase voltage pulse via the control line to all the sub-blocks of the multiple sub-blocks. That is a voltage pulse is applied to a bit line that connects to all four sub-blocks of FIG. 4F and/or the erase voltage pulses applied to the source line that is connected to all four sub-blocks. In step 658, the system performs erase verify for only one sub-block as a representative of all the multiple sub-blocks. If the verify process of step 658 is successful (step 660), then the erase process is complete (step 662). However, if the verify process of step 658 is not successful (step 660), then the process loops back to step 656 and repeats. Thus, additional erase voltage pulses will be applied to the one or more control lines until the block is sufficiently erased.

In one embodiment, a block of memory cells is sufficiently erased when all memory cells have been properly erased so that all NAND strings conduct. In another embodiment, the erase process is complete when a sufficient number of NAND strings conduct. That is, the system will tolerate a small number of errors, as a small number of errors can be corrected using error correction codes.

In one embodiment, steps 650, 656, 658, 660 and 662 are performed by erase circuit 510; step 654 is performed by erase speed circuit 514 and step 652 is performed by a combination of erase circuit 510 and monitoring circuit 512. In some embodiments, the process of FIG. 10 is performed at the direction of state machine 312 or a micro controller using all of the circuits depicted in FIG. 2.

Figure 10B:
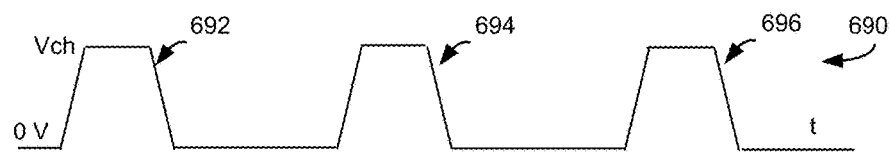
FIG. 10B is a signal diagram depicting channel voltage in a NAND string.

FIGS. 10A and 10B provide more details of the erase process. FIG. 10A is a signal diagram depicting an erase voltage applied to one or more control lines (e.g. one or more bit lines and/or a source line) and a selection signal applied to a selection line (source side selection line or drain side selection line) that is connected to a select gate. FIG. 10B is a signal diagram depicting a channel voltage in a NAND string. FIG. 10A depicts example voltages for use when performing an erase operation, where the erase operation uses GIDL to charge up the channel of a NAND string, such as in a 3D non-volatile memory device performing any of step 550 of FIG. 8, step 602 of FIG. 9, step 650 of FIG. 10 and step 656 of FIG. 10. FIG. 10B is time synchronized to FIG. 10A and depicts channel voltage for a NAND string being erased. In both FIGS. 10A and 10B, the vertical axis depicts voltage and the horizontal axis depicts time.

The waveform 670 depicts a series of control line (e.g., bit line and/or source line) voltage pulses 672, 674 and 676 with magnitudes of Verase1a, Verase2a and Verase3a, respectively, which step up in each erase-verify iteration. In one embodiment, Verase1a=15V. The waveform also depicts selection line (SGD and/or SGS) voltages 682, 684 and 686 with a common magnitude of Vesl, in one example approach. This value can be adjusted as discussed herein (see steps 554, 608, 654, 712 and 808). In another approach, the SGD and/or SGS voltages also step up with the bit line and/or source line voltage. The waveform provides a number of erase-verify loops EV1a, EV2a and EV3a, each of which includes an erase portion and an erase verify portion. The channel of a NAND string can be charged up in an erase operation based on GIDL, which is generated in proportion to the drain-to-gate voltage of the SGS/SGD transistors at the drain-end and/or source-end of the NAND sting. In another option, the erase voltage steps up to its peak in two steps instead of one to allow time for the charge up of the channel to occur. In another option, the erase voltage and the SGS/SGD voltage both step up to their peaks in two steps. This approach is particularly suitable for a 3D non-volatile memory device.

FIG. 10B depicts an example channel voltage (Vch) represented by a waveform 690 which has elevated portions 692, 694 and 696 coincident with the elevated voltages of FIG. 10A. In the approach of FIGS. 10A and 10B, the word line voltage for a selected block is at a low level, e.g., 0 V or close to 0 V, which provides a positive channel-to-gate voltage.

Figures 11, 12:
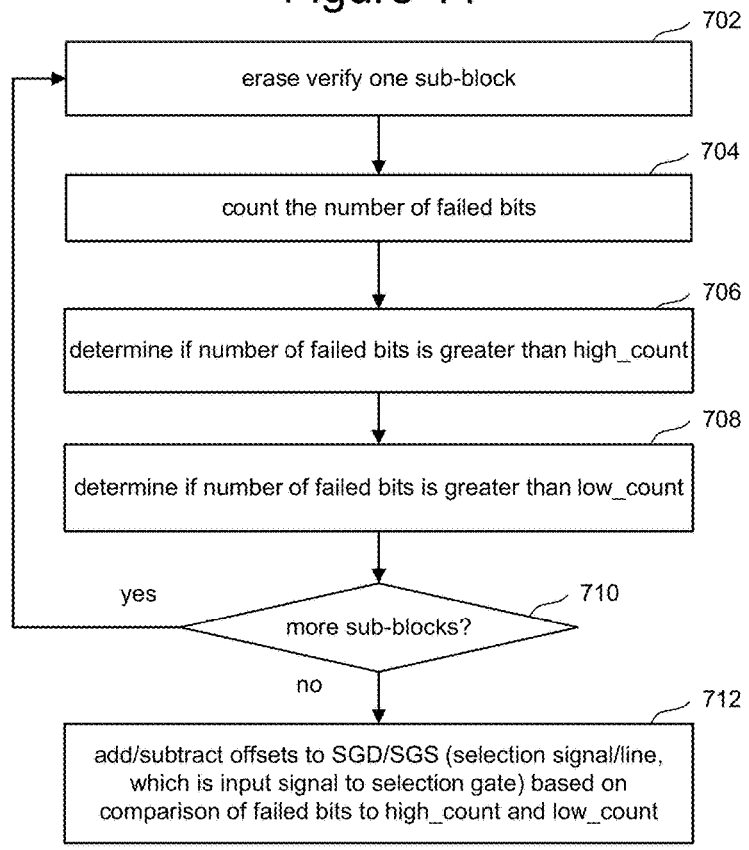
FIG. 11 is a flow chart describing one embodiment of a process for performing erase verify and adjusting erase speed.
FIG. 12 is a table providing an example of offsets to add to a selection signal in order to adjust erase speed.

FIG. 11 is a flowchart describing one embodiment of a process to perform erase verify and adjusting erase speed. Thus, the process of FIG. 11 is one example implementation of steps 652 and 654 of FIG. 10. The process of FIG. 11 includes determining for each sub-block whether an amount of memory cells not properly erased exceeds a threshold and adjusting the input signal for at least a subset of the selection gates for sub-blocks by adding a voltage offset to the input signal for the respective sub-block when the amount of memory cells not properly erased exceeds the threshold. In step 702, the system performs erase verify for only one sub-block. In one embodiment, the process of step 702 is performed by erase circuit 510 and/or state machine 312 (or a micro controller). In step 704, the system counts the number of bits that failed the erase verify of step 702. In step 706, the system determines whether the number of bits that failed erase verify is greater than a predetermined value referred to as high_count. In step 708, the system determines whether the number of failed bits is greater than a predetermined number referred to as low_count. High_count and low_count can correlate to some percentage of success; for example, low_count can correlate to 25% failed bits and high_count can correlate to 60% failed bits. Other values can also be used. A failed bit for purposes of steps 704-708 refers to a NAND string that does not conduct in response to all of the memory cells receiving the compare voltage at their respective control gates. In one embodiment, when performing erase verify of step 702, all the control gates of the memory cells being tested will receive Vevx (depicted in FIG. 5). This Vevx is driven on all of the word lines for the block.

Steps 702-708 are performed separately for each sub-block. Therefore, in step 710, it is tested whether there are more sub-blocks to be erase verified. If so, then the process loops back to step 702. Thus, step 702-708 are performed four times for a system that has four sub-blocks. When all sub-blocks have been processed, then step 712 is performed which includes adding or subtracting offsets to the SGD/SGS selection signals (e.g. SGD0, SGD1, SGD2, SGD3, SGS0, SGS1, SGS2, SGS3) based on the comparison of failed bits for each sub-block to high_count to low_count. For example, if it is necessary to speed up sub-block SB0, then SGD0 and/or SGS0 will receive a positive voltage offset. Alternatively, if it is necessary to slow down sub-block SB0, then SGD0 and/or SGS0 can receive a negative voltage offset.

FIG. 12 is a table describing how to compare the number of failed bits to high_count and low_count in steps 706 and 708, and apply the offsets in step 712. The nominal voltage applied to the SGD signal or the SGS signal is Vesl. When comparing a sub-block's failed bits in step 706 and 708, if the number of failed bits is both below low_count and below high_count, (pass in both instances), then in subsequent erase voltage pulses the appropriate SGD or SGS selection line will continue to receive Vesl (the second row of FIG. 12). In one embodiment, Vesl is 11.2 V. If, however, the sub-block has a number of failed bits that is greater than low_count but less than high_count (the third row of FIG. 12), then in the subsequent erase voltage pulses the selection lines will receive a voltage offset of offset1 such that the appropriate SGD or SGS signal will be Vesl+offset1. In one embodiment, offset1=0.2V Other values can also be used. If the number of failed bits is greater than low_count and greater than high_count (failed both tests), as per the fourth row of FIG. 12, then in subsequent erase voltage pulses the appropriate selection lines SGD or SGS will receive Vesl+offset2. In one embodiment, offset2=2V. Other values can also be used.

FIG. 13 is a flowchart describing another embodiment of a process for performing erase verify and adjusting speed. That is, FIG. 13 provides another example implementation of steps 652 and 654 of FIG. 10. In the embodiment of FIG. 13, the sensing information about erase speed comprises determining for each sub-block whether amounts of memory cells having threshold voltages above certain reference values exceed a predetermined number. In step 802 of FIG. 13, the system performs multiple erase verify operations on one sub-block at different reference values. For example, a first erase verify operation can be performed by testing whether the memory cells have threshold voltages above or below Vevx, a second erase verify operation can be performed by testing whether the memory cells have a threshold voltage above or below Vevx+$\Delta$, a third erase verify operation can be performed by testing whether the memory cells have a threshold voltage above or below Vevx+2 Δ, . . . . In one embodiment, Vev=0V, Vevx=0.2V and Δ=0.2V. However, other values can be used. In some embodiments, step 802 will only perform two erase verify operations for a sub-block. In other embodiments, more than two verify operations will be performed for a sub-block in step 802. In step 804, the system counts the number of failed bits for each of the multiple erase verify operations of step 802. As steps 802-804 are performed for one sub-block, those two steps must be repeated for each of the other sub-blocks. Therefore, in step 806, it is determined whether there are more sub-blocks to operate on. If so, the process loops back to step 804. If steps 802 and 804 have been performed on all sub-blocks of the block, then at step 808 the system adds or subtracts an appropriate voltage offset to the appropriate selection line SGD/SGS (which is a selection signal line that serves as an input signal to a selection gate) based on the amount of failed bits for each of the erase verify operations.

In one embodiment, the process of FIG. 13 will perform two erase verify operations for each sub-block. FIG. 14 is a table which describes the performance of two erase verify operations and how offsets will be added or subtracted to the appropriate selection line(s). For a given sub-block, if the sub-block passed erase verify for Vevx and Vevx+Δ (e.g. all or more than a predetermined percentage of NAND strings conducted in response to those voltages), then no offset needs to be added or subtracted and, therefore, in subsequent erase voltage pulses Vesl will be applied to the selection lines (SGD/SGS). If the sub-block failed the verify operation in response to Vevx but passed the erase verify operation for Vevx+Δ, then in subsequent erase voltage pulses the selection line(s) for that sub-group will receive Vesl+offset1. If the sub-block failed erase verify for Vevx and Vevx+Δ, then in subsequent erase voltage pulses, the selection line(s) will receive Vesl+offset2.

FIG. 15 is a table describing an embodiment where three erase verify operations are performed in step 802 of FIG. 13. Those three erase verify operations are performed for Vevx, Vevx+Δ and Vevx+2Δ. If a sub-block passed all three verify operations, then no offset needs to be added or subtracted and in future erase voltage pulses the selection line(s) will receive Vesl. If the sub-blocks failed the verify operation for Vevx, but passed the erase verify operation for Vevx+Δ and Vevx+2Δ, then in future erase voltage pulses the appropriate selection line(s) SGD/SGS will receive Vesl+offset1. If the sub-block failed the erase verify operation for Vevx and Vevx+Δ, but passed the erase verify operation for Vevx+2Δ, then in subsequent erase voltage pulses the appropriate selection line(s) (SGD/SGS) will receive Vesl+offset2. If the sub-block failed all three erase verify operations, then in subsequent erase voltage pulses the appropriate selection line(s) will receive Vesl+offset3. In one embodiment, Voffset3=4V. Other values can also be used.

By separately controlling the speed of erase for different subsets of memory cells in response to observing speed information from those subsets of memory cells during the erasing process, the entire overall erase process will be performed faster, using less current/power and the resulting various memory cells being at a common erase depth (which can reduce the number of errors).

One embodiment includes as apparatus comprising a plurality of non-volatile memory cells including a group of connected memory cells; an erase circuit connected to the memory cells and configured to erase the group of connected memory cells by applying an erase signal to the group of connected memory cells; and an erase speed circuit configured to adjust an erase speed for a subset of the group of connected memory cells.

One embodiment includes a system comprising a plurality of non-volatile memory cells including a group of connected memory cells arranged in multiple sub-groups of connected memory cells and peripheral circuits connected to the plurality of non-volatile memory cells. The peripheral circuits are configured to apply a series of erase voltage bursts to the group of connected memory cells, separately erase verify each of the multiple sub-groups after a first erase voltage burst, characterize erase progress after the first erase voltage burst, adjust one or more voltages to the sub-groups to cause erase performance of the sub-groups to converge during subsequent one or more additional erase voltage bursts, and erase verify only a subset of the multiple sub-groups as a representative of all of the multiple sub-groups in response to the one or more additional erase voltage bursts.

One embodiment includes a method comprising applying an erase voltage pulse via a control line to multiple sub-blocks of a block of memory cells, the control line connected to the memory cells via selection gates having input signals; sensing information about erase speed for each of the multiple sub-blocks in response to the erase voltage pulse; applying one or more additional erase voltage pulses via the control line to the multiple sub-blocks; and adjusting an input signal for at least a subset of the selection gates based on the information about erase speed to cause erase speed for each of the multiple sub-blocks to converge in response to the one or more additional voltage pulses.

One embodiment includes an apparatus comprising a three dimensional memory array comprising a plurality of non-volatile memory cells including a block of memory cells divided into multiple sub-blocks, the memory cells are arranged in vertical NAND strings, each vertical NAND string includes data memory cells and selection gates, selection signals control the selection gates to selectively connect control signals to the NAND strings. The apparatus further comprises an erase circuit connected to the memory cells and configured to erase the group of connected memory cells by applying multiple erase pulses to control signals for all of the multiple sub-blocks; a monitoring circuit configured to determine erase progress for each sub-block; and an erase speed circuit configured to adjust erase speed during a subsequent erase pulse for a subset of the sub-blocks based on the determined erase progress by adding a voltage offset to one or more selection signals during the subsequent erase pulse.

One embodiment includes an apparatus comprising a plurality of non-volatile memory cells including a group of connected memory cells arranged in sub-groups of connected memory cells; and means for erasing the memory cells by separately controlling an erase speed for the sub-groups of connected memory cells in response to observing speed information for the sub-groups of connected memory cells during the erasing.

Examples of the means for erasing the memory cells by separately controlling an erase speed include the components of FIG. 2 at the direction of state machine 312 (or a microcontroller), the components of FIG. 7 (e.g., erase circuit 510, monitoring circuit 512 and erase speed circuit 514) or similar circuits, performing all or a portion of the processes of FIG. 8, 9 or 10 (which may include the processes of FIG. 11 or 13).

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of non-volatile memory cells including a group of connected memory cells, the group of connected memory cells is a block of memory cells sharing a common set of word lines across the block, the block of memory cells includes multiple sub-block of memory cells, each sub-block of the multiple sub-blocks has its own set of one or more selection lines with respect to other sub-blocks of the block of memory cells;
an erase circuit connected to the memory cells and configured to erase the group of connected memory cells by applying an erase signal to the group of connected memory cells; and
an erase speed circuit configured to adjust an erase speed for a subset of the group of connected memory cells by adjusting voltages on the selection lines.

2. The apparatus of claim 1, wherein:
the erased circuit is configured to apply the erase signal to the group by applying a burst of voltage to all of the sub-block of memory cells; and
the erase speed circuit is configured to separately adjust erase speed for the sub-blocks of memory cells.

3. The apparatus of claim 1, further comprising:
a monitoring circuit, the monitoring circuit configured to determine erase progress for each of the sub-blocks of memory cells, the erase speed circuit is configured to adjust erase speed for a subset of the sub-blocks of memory cells based on the determined erase progress.

4. The apparatus of claim 3, wherein:
the erase circuit is configured to erase the group of memory cells by applying erase pulses to the multiple sub-blocks of memory cells including applying one or more erase pulses subsequent to the erase speed circuit adjusting erase speed for the subset of the sub-blocks of memory cells.

5. The apparatus of claim 3, wherein:
the erase circuit is configured to apply a first erase pulse to the multiple sub-blocks of memory cells;
the monitoring circuit is configured to determine erase progress for each of the sub-blocks of memory cells in response to the first erase pulse; and
the erase circuit is configured to apply one or more additional erase pulses subsequent to the erase speed circuit adjusting erase speed for the subset of the sub-blocks of memory cells.

6. The apparatus of claim 5, wherein:
the monitoring circuit is configured to determine erase progress for each of the sub-blocks of memory cells by performing erase verification for each of the sub-blocks of memory cells in response to the first erase pulse; and
the monitoring circuit is further configured to perform erase verification for less than all of the sub-blocks of memory cells in response to the one or more additional erase pulses.

7. The apparatus of claim 5, wherein:
the erase circuit is configured to apply the first erase pulse and the one or more additional erase pulses to all of the sub-blocks of memory cells;
the monitoring circuit is configured to determine erase progress for each of the sub-blocks of memory cells by performing erase verification for each of the sub-blocks of memory cells in response to the first erase pulse; and
the monitoring circuit is further configured to perform erase verification for only one of the sub-blocks of memory cells in response to the one or more additional erase pulses.

8. The apparatus of claim 1, wherein:
the multiple sub-blocks are connected to a control line;
the erase circuit is configured to erase the group of memory cells by applying erase pulses the control line;
each sub-block of the multiple sub-blocks has its own select gate that connect the respective to the control line; and
the erase speed circuit is configured to adjust erase speed by adjusting voltages applied to the select gates.

9. The apparatus of claim 1, wherein:
the group of connected memory cells are vertical NAND strings connected to a common set of word lines;
one NAND string in each sub-block is connected to a common bit line;
the erase signal is a set of erase voltage pulses;
the erase circuit is configured to apply a first erase voltage pulse and additional erase voltage pulses on the common bit line;
the one NAND string in each sub-block has its own drain side select gate that connects the common bit line to the NAND string;
each sub-block has its own drain side selection line with respect to the other sub-blocks that control drain side select gates for the sub-block; and
the erase speed circuit is configured to adjust erase speed by adjusting a voltage on one of the drain side selection lines.

10. The apparatus of claim 1, wherein:
the group of connected memory cells includes multiple NAND strings connected to a common set of word lines;
each of the NAND strings is connected to a common source line;
the erase signal is a set of erase voltage pulses;

the erase circuit is configured to apply a first erase voltage pulse and additional erase voltage pulses on the common source line;

each NAND string has its own source side select gate that connects the common source line to the NAND string;

each sub-block has its own source side selection line with respect to the other sub-groups that controls source side select gates for the sub-block; and the erase speed circuit is configured to adjust erase speed by adjusting a voltage on one of the source side selection lines.

11. A system, comprising:

a plurality of non-volatile memory cells including a group of connected memory cells arranged in multiple sub-groups of connected memory cells, each sub-group of connected memory cells has its own set of one or more selection lines with respect to other sub-groups of connected memory cells; and peripheral circuits connected to the plurality of non-volatile memory cells and configured to apply a series of erase voltage bursts to the group of connected memory cells, separately erase verify each of the multiple sub-groups after a first erase voltage burst, characterize erase progress after the first erase voltage burst for each of the multiple sub-groups, adjust one or more voltages on the selection lines of the sub-groups based on the characterization of the erase verify to cause erase operations of the sub-groups to converge towards completing at a same time, and erase verify only a subset of the multiple sub-groups as a representative of all of the multiple sub-groups in response to the one or more additional erase voltage bursts.

12. The system of claim 11, wherein:

the peripheral circuits include voltage sources, decoders and one of a state machine and a microcontroller.

13. A method of performing an erase process, the method comprising:

applying an erase voltage pulse via a control line to multiple sub-blocks of a block of memory cells, the control line connected to the memory cells via selection gates having input signals;

sensing information about erase speed for each of the multiple sub-blocks in response to the erase voltage pulse;

applying one or more additional erase voltage pulses via the control line to the multiple sub-blocks; and adjusting an input signal for at least a subset of the selection gates based on the information about erase speed to cause erase speed for each of the multiple sub-blocks to converge in response to the one or more additional voltage pulses so that all of the sub-blocks will complete the erase process at a same time.

14. The method of claim 13, wherein:

the sensing information about erase speed includes performing erase verification for the multiple sub-blocks of the block of memory cells; and the method further comprises performing erase verification for only one of the multiple sub-blocks of the block of memory cells after each of the one or more additional voltage pulses.

15. The method of claim 13, wherein:

the sensing information about erase speed comprises determining for each sub-block whether an amount of memory cells not properly erased exceeds a threshold; and the adjusting an input signal for at least a subset of the selection gates comprises adding a voltage offset to the input signal for a respective sub-block when the amount of memory cells not properly erased exceeds the threshold.

16. The method of claim 13, wherein:

the sensing information about erase speed comprises determining for each sub-block whether amounts of memory cells having threshold voltages above reference values exceed an amount.

17. An apparatus, comprising:

a plurality of non-volatile memory cells including a group of memory cells arranged in sub-groups of connected memory cells, each sub-group of connected memory cells is connected to a common control line and has its own select gate that connects to the common control line, each sub-group of connected memory cells has a separate selection line connected to its select gate; and means for erasing the memory cells by separately controlling an erase speed for the sub-groups of connected memory cells by adjusting one or more voltages on one or more of the separate selection lines in response to observing speed information for the sub-groups of connected memory cells during the erasing.

18. A non-volatile storage apparatus, comprising:

a common bit line;

a common set of word lines;

a plurality of selection lines;

a plurality of non-volatile memory cells arranged in multiple NAND strings connected to the common set of word lines and the plurality of selection lines, each of the NAND strings is connected to the common bit line, each NAND string of the multiple NAND strings has its own select gate that connects the common bit line to the respective NAND string, each NAND string of the multiple NAND strings has a separate selection line of the plurality of selection lines connected to its select gate; and a control circuit connected to the memory cells, the control circuit is configured to erase the memory cells by applying an erase signal to the memory cells and separately adjust an erase speed for a subset of the NAND strings by adjusting voltages on the selection lines.

19. The non-volatile storage apparatus of claim 18, wherein:

the erase signal is a series of erase voltage bursts; and the control circuit is configured to separately erase verify each of the multiple NAND strings after a first erase voltage burst, characterize erase progress after the first erase voltage burst for each of the NAND strings, and adjust one or more voltages to the selection lines to cause erase performance of the NAND strings to converge during subsequent one or more additional erase voltage bursts.

20. The non-volatile storage apparatus of claim 19, wherein:

the control circuit is configured to erase verify only a subset of the multiple NAND strings as a representative of all of the multiple NAND strings in response to the one or more additional erase voltage bursts.

* * * * *